(12) United States Patent
Wu et al.

(10) Patent No.: US 9,331,017 B2
(45) Date of Patent: May 3, 2016

(54) CHIP PACKAGE INCORPORATING INTERFACIAL ADHESION THROUGH CONDUCTOR SPUTTERING

(71) Applicant: Intel Corporation, Santa Clara, CA (US)

(72) Inventors: Tao Wu, Chandler, AZ (US); Islam A. Salama, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/506,357

(22) Filed: Oct. 3, 2014

(65) Prior Publication Data

US 2015/0021778 A1    Jan. 22, 2015

Related U.S. Application Data

(62) Division of application No. 13/599,411, filed on Aug. 30, 2012, now Pat. No. 8,871,634.

(51) Int. Cl.
| | |
|---|---|
| *H01L 23/48* | (2006.01) |
| *H01L 23/52* | (2006.01) |
| *H01L 29/40* | (2006.01) |
| *H01L 23/522* | (2006.01) |
| *H01L 21/768* | (2006.01) |
| *H01L 23/525* | (2006.01) |
| *H01L 23/532* | (2006.01) |

(52) U.S. Cl.
CPC .......... *H01L 23/5226* (2013.01); *H01L 21/768* (2013.01); *H01L 23/48* (2013.01); *H01L 23/525* (2013.01); *H01L 23/53228* (2013.01); *H01L 21/76877* (2013.01); *H01L 21/76883* (2013.01); *H01L 2924/0002* (2013.01)

(58) Field of Classification Search
USPC ............................. 257/758, 762, 750
See application file for complete search history.

(56) References Cited

U.S. PATENT DOCUMENTS

| | | | |
|---|---|---|---|
| 5,439,848 | A | 8/1995 | Hsu et al. |
| 2005/0020047 | A1 | 1/2005 | Mis et al. |
| 2007/0228571 | A1* | 10/2007 | Yu et al. ......................... 257/758 |
| 2007/0241460 | A1 | 10/2007 | Mis et al. |
| 2008/0012138 | A1* | 1/2008 | Wang et al. .................... 257/758 |
| 2008/0237870 | A1* | 10/2008 | Nakao et al. ................... 257/758 |

(Continued)

OTHER PUBLICATIONS

"U.S. Appl. No. 13/599,411, Corrected Notice of Allowability mailed Jul. 24, 2014", 2 pgs.

(Continued)

*Primary Examiner* — S. V. Clark
(74) *Attorney, Agent, or Firm* — Schwegman Lundberg & Woessner, P.A.

(57) ABSTRACT

This disclosure relates generally to an electronic device and method having can include a method of making a chip package. An insulator layer comprising an insulator material, the insulator layer positioned with respect to a first conductive line, forming a second conductive line with respect to the insulator layer, wherein the insulator layer is positioned between the first conductive line and the second conductive line, forming a opening in the insulator layer between the first conductive line and the second conductive line, at least some of the insulator material within the opening being exposed, and chemically bonding a conductor to the at least some of the insulator material within the opening, wherein the conductor electrically couples the first conductive line to the second conductive line.

10 Claims, 4 Drawing Sheets

(56) References Cited

U.S. PATENT DOCUMENTS

| | | | |
|---|---|---|---|
| 2009/0127711 A1* | 5/2009 | Bonilla et al. | 257/758 |
| 2012/0319281 A1* | 12/2012 | Watanabe | 257/758 |
| 2013/0175691 A1* | 7/2013 | Watanabe | 257/758 |
| 2014/0061927 A1 | 3/2014 | Wu et al. | |

OTHER PUBLICATIONS

"U.S. Appl. No. 13/599,411, Non Final Office Action mailed Feb. 14, 2014", 6 pgs.

"U.S. Appl. No. 13/599,411, Notice of Allowance mailed Jun. 23, 2014", 5 pgs.

"U.S. Appl. No. 13/599,411, Response Filed May 14, 2014 to the Non Final Office Action mailed Feb. 14, 2014", 7 pgs.

"U.S. Appl. No. 13/599,411, Response filed Oct. 25, 2013 to Restriction Requirement mailed Sep. 26, 2013", 5 pgs.

"U.S. Appl. No. 13/599,411, Restriction Requirement mailed Sep. 26, 2013", 5 pgs.

\* cited by examiner

CHIP PACKAGE INCORPORATING INTERFACIAL ADHESION THROUGH CONDUCTOR SPUTTERING

This application is a divisional of U.S. patent application Ser. No. 13/599,411, filed on Aug. 30, 2012, now issued as U.S. Pat. No. 8,871,634 which is incorporated herein by reference in its entirety.

TECHNICAL FIELD

The disclosure herein relates generally to interfacial adhesion of a conductor to an insulator in an electronic chip package and methods therefor.

BACKGROUND ART

Electronic chip packages have long utilized conductive lines in multiple layers separated by insulators. The use of multiple layers allows for the stacking of conductive lines, reducing chip area. A discrete conductor known in the art as a "via" may extend through an insulator to electrically couple one conductive line in one layer to a second conductor line in a second layer separated by the insulator. Vias may include a conductive material similar or the same to that of the conductive lines, such as copper, in contact between the conductive lines connected by the vias. A bonding material, such as palladium, may provide coupling between the conductive material in the via and the insulative material exposed by drilling the via into the insulator.

DESCRIPTION OF THE EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

A via within an insulator may conventionally be formed by drilling or otherwise opening a hole in the insulator. The materials that are commonly utilized as conductors, such as electroless plated copper, may not affix readily in direct contact with the material surface of the insulator when conventional application techniques are used, such as electroless copper plating. Hence, bonding materials, such as palladium, have been utilized to contact first with the insulator, then copper is mechanically coupled, such as by plating or laminating, to the bonding material in order to complete the via. Consequently, the conductive material that creates an electrical link between the conductive lines separated by the insulator is not substantially in direct contact with the insulative material. Rather, the conductive material is substantially or entirely in direct contact with the bonding material.

New methodologies for creating a direct, chemical bond between the insulator and the conductive material have been developed. In an example, by creating a via hole in the insulator with a sufficient roughness, and then sputtering the conductive material into direct contact with the insulative material in the via hole, the conductive material may form a chemical bond with the insulative material in the via. By creating the chemical bond, the bonding material may be dispensed with, resulting in the ability to create a via that may be smaller and that may utilize fewer steps in fabricating. In addition, the chemical bond between the insulator surface material and the conductive material may be relatively more resilient than a mechanical bond.

Figure 1:
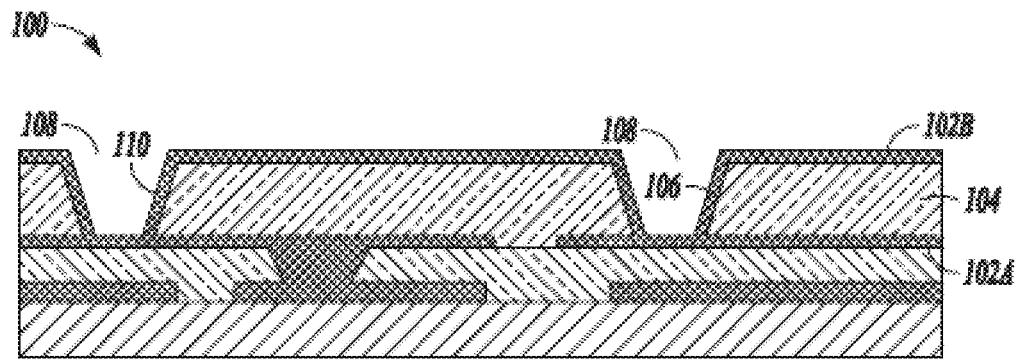
FIG. 1 is a side profile of a chip package.

FIG. 1 is a side profile of a chip package 100. The chip package includes conductive lines 102, including conductive lines 102a, 102b. In various examples, the conductive lines 102a, 102b are made from copper or other material known in the art or yet to be developed that is useful to conduct electrical signals. The conductive lines 102a, 102b are physically separated by an insulator layer 104. The insulator layer 104 is substantially non-conductive of electrical signals to a degree that would be understood by one of ordinary skill in the art.

A via 106 formed in the insulator layer 104 electrically couples two conductive lines 102a, 102b that would otherwise be isolated with respect to one another by the insulator layer 104. The via 104 is formed by creating a via hole 108 in the insulator layer 104. A via conductor 110 is then applied within the via hole 108 in electrical contact with the conductive lines 102a, 102b. The via conductor 110 may be the same or substantially the same material as makes up the conductive lines 102a, 102b. As a result, an electrical signal one of the conductive lines 102, such as conductive line 102a, can pass through the via 106 by way of the via conductor 110 to the other conductive line 102b.

As illustrated, the via conductor 110 is in direct contact with insulator material of the insulator layer 104 that is exposed within the via hole 108. As applied within the via hole 108, the via conductor 110 interacts directly and physically securely with the insulator material of the insulator layer 104, in contrast with a via that incorporates a bonding material, such as palladium, between a via conductor and insulator material. The absence of the bonding material may allow the conductive lines 102 and the via 106 to be relatively smaller than when a via that incorporates the bonding material.

While the above example pertains specifically to the application of the via conductor 110 within the via 108, the formation of a chemical bond between a conductor, such as copper, and the insulator material can apply equally well to that of, for instance, the conductor 102 and the insulator 104. In an example, the conductor 102 is formed with a chemical bond with the insulator 104 according to the methodologies disclosed herein. The chemical bonds disclosed herein can be coordinated chemical bonds. The chemical bond formed between the conductor and the insulator can stand in contrast to a mechanical bond, such as can be created by a van der Waals attraction.

Figure 2:
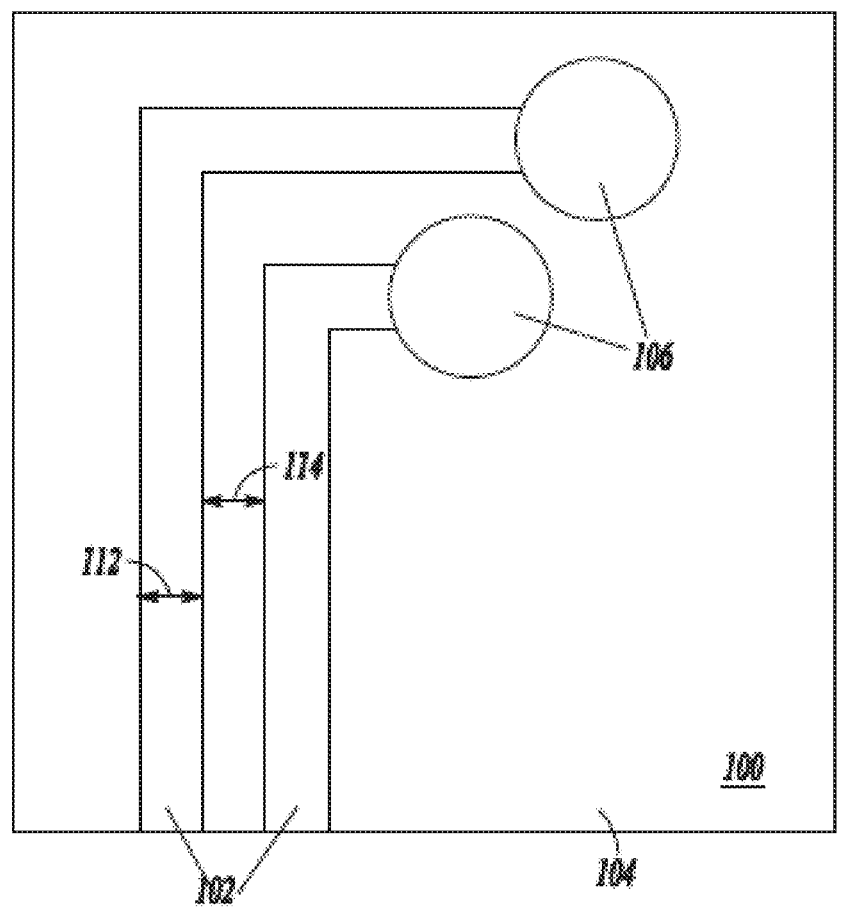
FIG. 2 is a top view of the chip package.

FIG. 2 is a top view of the chip package 100. In an example, the conductive lines 102 are approximately five (5) micrometers in width 112 and have a lateral physical separation 114 of approximately five (5) micrometers. Such dimensions are known in the art as a "5/5" process. As would be apparent to one of ordinary skill in the art, the structures and methods described herein can be applicable to processes of greater or lesser size then the "5/5" process.

In order to support the "5/5" process, the via 106 may be sufficiently small to interact properly with the conductive lines 102. However, while conventional surface roughness on the insulator material of the insulator layer 104 within the via hole 108 may allow for mechanical bonding between the via conductor 110 and the insulator material, insulator material with such roughness within the via hole 108 may not be made small enough to accommodate the "5/5" process. For instance, the roughness may consume more of the diameter of the via hole 108 than may permit space for inserting the via conductor 110. The surface of the insulator layer 104 can be smoothed to support the 5/5 process and chemical bonding.

However, as the insulator material within the via hole 108 becomes more smooth, the capacity for the via conductor 110 to mechanically bond with the insulator material may be reduced; because relatively more surface area may better promote mechanical bonding, and a rough surface incorporates more surface area, smoothing the insulator material may make mechanical bonding more difficult. In various examples, the insulator material in the via hole 108 is relatively smooth and the via conductor 110 is chemically bonded with the insulator material. In an example, the surface roughness of the insulator material configured to support chemical bonding has an arithmetic mean value (Ra) of less than about two hundred (200) nanometers. In an example, the via conductor 110 is applied within the via hole 108 using a sputtering process, such as one of various sputtering processes known to those of ordinary skill in the art.

In various examples, the via 106 may be of similar size to that of the width of the conductive line 102, such as five (5) micrometers. The via 106 may be kept relatively small in order to promote efficient utilization of the available area of the chip package 100. In various examples, the via may be significantly larger than the width of the conductive lines 102, such as to promote manufacturing of the via 106 and access to the via 106. In an example, the via 106 has a diameter of approximately seventy-five (75) micrometers.

Figure 3A:
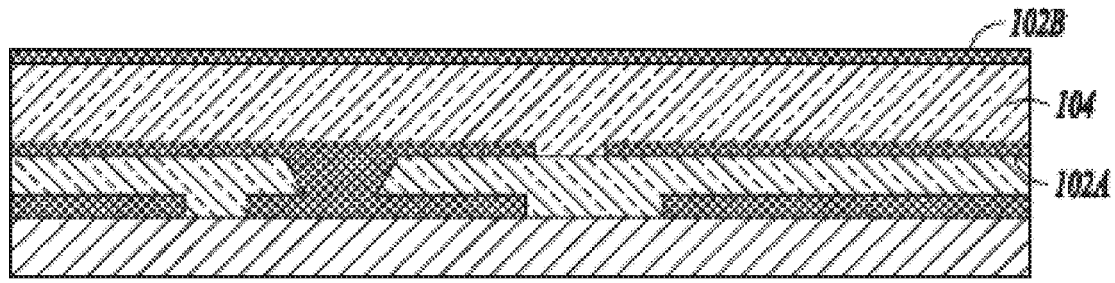
FIGS. 3a-3c are a sequential process flow for making the chip package.
Figure 3B:
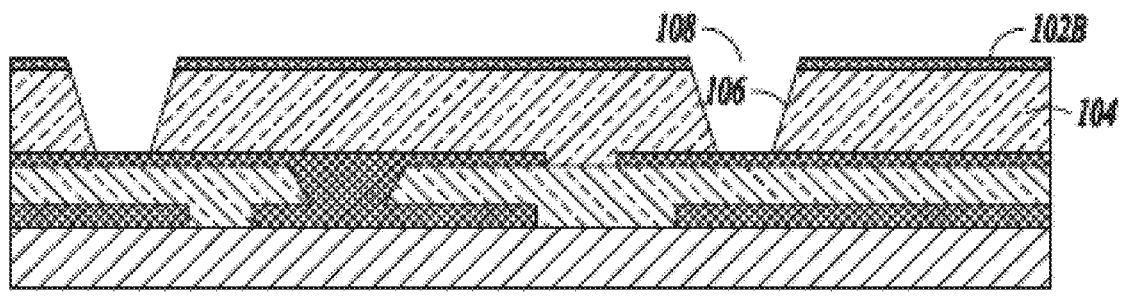
Figure 3C:
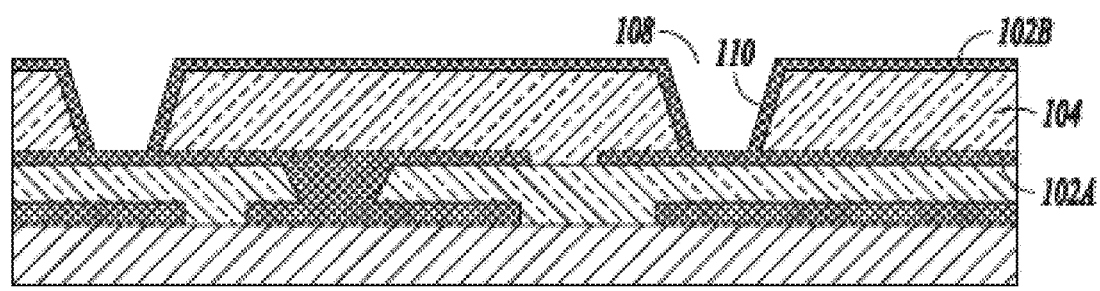

FIGS. 3*a*-3*c* illustrate a sequential process flow for making the chip package 100. The process flow may further be utilized for making a variety of chip packages, while the chip package 100 itself may be made according to any suitable process.

In FIG. 3*a*, the chip package 100 is substantially formed or otherwise provided. An insulator layer 104*a* is formed on top of a conductive line 102*a*. In various examples, the insulator layer is not fully cured. In various examples, the insulator layer 104 is cured to approximately 90% to 99%. In such examples, the insulator layer 104 as not fully cured is somewhat but not substantially reactive.

In various examples, a conductive line 102*b* is formed on top of the insulator layer 104 by laminating thin film copper on top of the insulator layer 104. In an example, the copper is approximately two hundred (200) nanometers thick. In various examples, all of the conductive lines 102 are formed by laminating thin film copper directly onto the insulator layer. In various examples, the conductive line 102*b* is formed by sputtering a deposit of the conductive line 102*b*, such as copper, on the insulator layer 104 and then laminating the remainder of the conductive line 102*b* onto the sputtered deposit. In an example, the insulator layer 104 is desmeared prior to sputtering the conductive line 102 deposit.

In FIG. 3*b*, the via hole 108 of the via 106. In various examples, the via hole 108 is formed at least in the insulator layer 104 as well as in the conductor line 102*b*. In various examples, the via hole 108 is formed by drilling, such as by laser drilling. In various examples, the via hole 108 is formed according to any suitable process for forming a via hole known in the art. In various examples, the via hole 108 is subjected to a desmear process. The desmear process may roughen the exposed insulator material in the via hole 108. In an example, the surface roughness of the insulator material has an arithmetic mean value (Ra) of less than about two hundred (200) nanometers.

In FIG. 3*c*, the via conductor 110 is formed within the via hole 108. The via conductor 110 is in direct contact with the insulator material of the insulator layer 104. The via conductor 110 may electrically couple the conductive lines 102*a*, 102*b* with respect to one another. The via conductor 110 may be chemically bonded with the insulator material. In various examples, the via conductor 110 is formed within the via hole 108 by a sputtering process.

In an example, the via conductor 110 is a maximum of approximately five hundred (500) nanometers thick. In various examples, the thickness of the via conductor 110 is tapered between the conductive lines 102. In various examples, a deposit of the via conductor 110 is sputtered within the via hole 108 and then the remainder of the via conductor 110 is applied to the deposit, such as by lamination.

Figure 4:
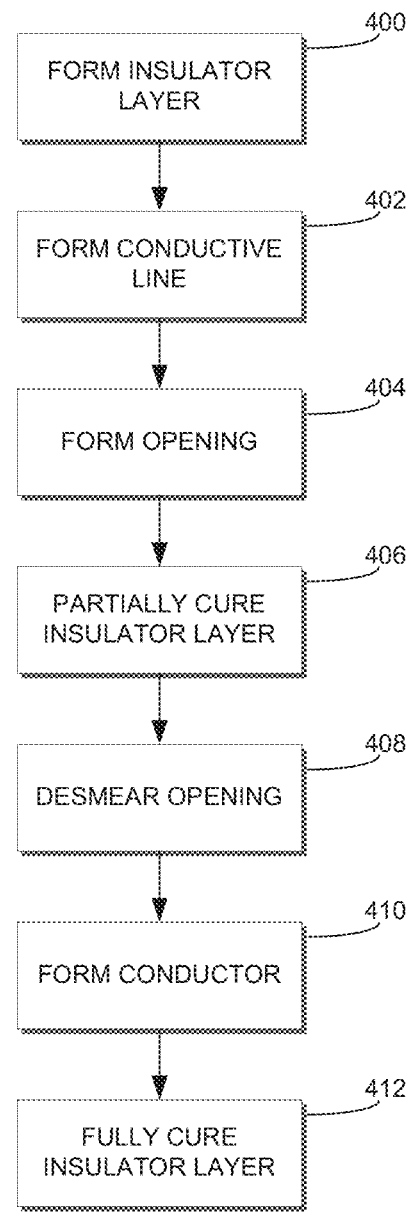
FIG. 4 is a flowchart for making a chip package.

FIG. 4 is a flowchart for making the chip package 100. The flowchart may be applied to the creation of a variety of chip packages or other electronic devices in addition to the chip package 100. Additionally, the chip package 100 may alternatively be made according to any of a variety of suitable methods.

At 400, the insulator layer 104 is formed with respect to a conductive line 102*a*. The insulator layer 104 may be an epoxy-based buildup layer and may be formed on the conductive line 102*a*. The insulator layer 104 may be formed according to any of a variety of processes that would be apparent to one of ordinary skill in the art.

At 402, a conductive line 102*b* is formed with respect to the insulator layer 104, with the insulator layer 104 positioned between the first and second conductive lines 102*a*, 102*b*. The conductive line 102*b* may be a transfer film and may be formed by laminating the conductive line 102*b* to the insulator layer 104. The insulator layer 104 may be desmeared prior to forming the conductive line 102*b*.

At 404, an opening, such as the via hole 108, is formed in the insulator. At least some of the insulator material of the insulator layer 104 may be exposed within the via hole 108. The via hole 108 may further be formed in at least one of the conductive lines 102. The via hole 108 may be formed by drilling, such as by laser drilling.

At 406, the insulator layer 104 is only partially cured. The insulator layer 104 may be approximately 90% cured, approximately 99% cured, or may be cured to other percentages. In various examples, the reactivity of the insulator layer 104 may be substantially but not fully reduced.

At 408, the via hole 108 is desmeared. In various examples, the exposed surface of the insulator layer 104 within the via hole 108 is desmeared in full or in part. In addition to or in substitution for desmearing the via hole 108, the insulator layer 104 may have been desmeared to promote chemical bonding with the conductive line 102*b*.

At 410, the via conductor 110 is formed in direct contact with the insulator material of the insulator layer 104 exposed within the via hole 108. The via conductor 110 may be chemically bonded with the insulator material 104, such as by sputtering the via conductor 110 within the via hole 108. The via conductor 110 may electrically couple the conductive lines 102*a*, 102*b*.

At 412, the insulator layer 104 may be substantially fully cured. The insulator layer 104 may be more than 99% cured to be substantially fully cured.

Figure 5:
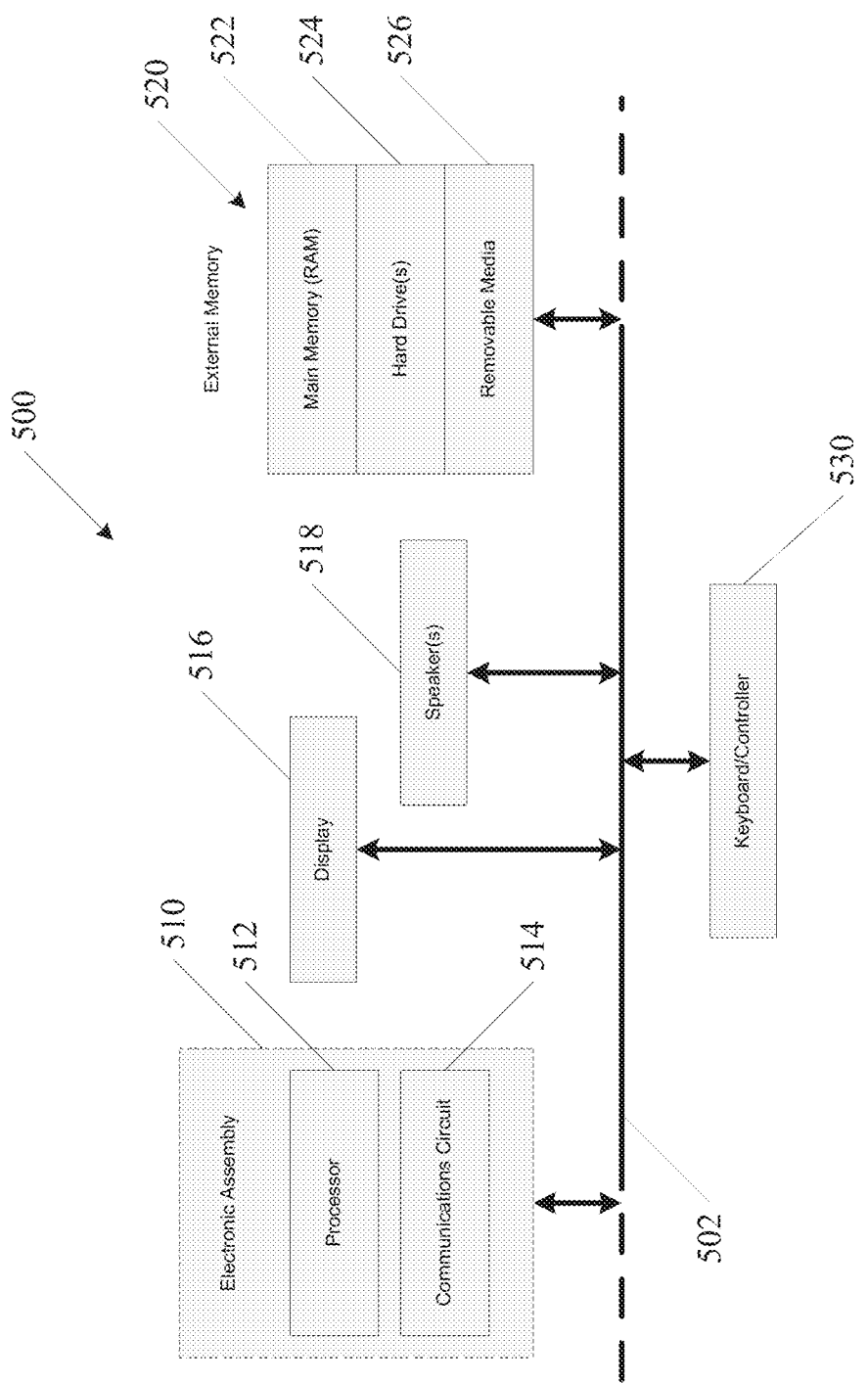
FIG. 5 is a block diagram of an electronic device incorporating at least one chip package.

An example of an electronic device using semiconductor chips and elongated structures as described in the present disclosure is included to show an example of a higher level device application for the present invention. FIG. 5 is a block diagram of an electronic device 500 incorporating at least one chip package 100. The electronic device 500 is merely one example of an electronic system in which embodiments of the present invention can be used. Examples of electronic devices 500 include, but are not limited to personal computers, tablet computers, mobile telephones, personal data assistants, MP3 or other digital music players, etc. In this example, the electronic device 500 comprises a data processing system that includes a system bus 502 to couple the various components of the system. The system bus 502 provides communications links among the various components of the electronic device 500 and can be implemented as a single bus, as a combination of busses, or in any other suitable manner.

An electronic assembly 510 is coupled to the system bus 502. The electronic assembly 510 can include any circuit or combination of circuits. In one embodiment, the electronic assembly 510 includes a processor 512 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in the electronic assembly 510 are a custom circuit, an application-specific integrated circuit (ASIC), or the like, such as, for example, one or more circuits (such as a communications circuit 514) for use in wireless devices like mobile telephones, pagers, personal data assistants, portable computers, two-way radios, and similar electronic systems. The IC can perform any other type of function.

The electronic device 500 can also include an external memory 520, which in turn can include one or more memory elements suitable to the particular application, such as a main memory 522 in the form of random access memory (RAM), one or more hard drives 524, and/or one or more drives that handle removable media 526 such as compact disks (CD), digital video disk (DVD), and the like.

The electronic device 500 can also include a display device 616, one or more speakers 518, and a keyboard and/or controller 530, which can include a mouse, trackball, touch screen, voice-recognition device, or any other device that permits a system user to input information into and receive information from the electronic device 500.

Additional Examples

Example 1 may include subject matter (such as an apparatus, a method, a means for performing acts) that can include a method of making a chip package. The method may comprise forming an insulator layer comprising an insulator material, the insulator layer positioned with respect to a first conductive line, forming a second conductive line with respect to the insulator layer, wherein the insulator layer is positioned between the first conductive line and the second conductive line, forming a opening in the insulator layer between the first conductive line and the second conductive line, at least some of the insulator material within the opening being exposed, and chemically bonding a conductor to the at least some of the insulator material within the opening, wherein the conductor electrically couples the first conductive line to the second conductive line.

In Example 2, the method of Example 1 can optionally further include that the conductor is chemically bonded to the insulator material by sputtering the conductor into the opening.

In Example 3, the method of any one or more of Examples 1 and 2 can optionally further comprise only partially curing the insulator layer prior to chemically bonding the conductor to the insulator material.

In Example 4, the method of any one or more of Examples 1-3 can optionally further include that only partially curing the insulator layer comprises reducing a chemical reactivity of an epoxy of the insulator material to not less than approximately ten percent.

In Example 5, the method of any one or more of Examples 1-4 can optionally further include that only partially curing the insulator layer comprises reducing a chemical reactivity of an epoxy of the insulator material to not less than approximately one percent.

In Example 6, the method of any one or more of Examples 1-5 can optionally further comprise substantially fully curing the insulator layer after chemically bonding the conductor to the insulator layer.

In Example 7, the method of any one or more of Examples 1-6 can optionally further include that the opening extends through the insulator layer to expose a surface of the first conductive line. The method can optionally further comprise, prior to chemically bonding conductor, desmearing at least one of the insulator material in the opening and the surface of the first conductive line.

In Example 8, the method of any one or more of Examples 1-7 can optionally further include that the desmearing provides a smoothness of at least about two hundred (200) nanometers.

In Example 9, the method of any one or more of Examples 1-8 can optionally further comprise laminating at least one of the first conductive line and the second conductive line to the insulator layer.

In Example 10, the method of any one or more of Examples 1-9 can optionally further include that at least one of the first conductive line and the second conductive line is a transfer film.

In Example 11, the method of any one or more of Examples 1-10 can optionally further include that the first conductive line, the second conductive line and the conductor are comprised of copper.

In Example 12, the method of any one or more of Examples 1-11 can optionally further include that the insulator layer is a buildup layer.

In Example 13, the method of any one or more of Examples 1-12 can optionally further include that the opening and the conductor comprise a via.

Example 14 may include subject matter (such as an apparatus, a method, a means for performing acts) that can include an electronic device that includes an electronic chip, a substrate coupled to the chip, including a conductive line, comprising a first copper layer, a second copper layer, an insulator layer positioned between the first conductive line and the second conductive line, and a via, formed through the insulator layer, including a copper conductor, abutting and chemically bonded to the insulator layer, that electrically couples the first conductive line to the second conductive line.

In Example 15, the device of Example 14 can optionally further include that the conductor is chemically bonded to the insulator material by sputtering the conductor into the opening.

In Example 16, the device of any one or more of Examples 14 and 15 can optionally further include that the insulator layer is only partially cured prior to the conductor being chemically bonded to the insulator material.

In Example 17, the device of any one or more of Examples 14-16 can optionally further include that only partially curing the insulator layer comprises reducing a chemical reactivity of an epoxy of the insulator material to not less than approximately ten percent.

In Example 18, the device of any one or more of Examples 14-17 can optionally further include only partially curing the insulator layer comprises reducing a chemical reactivity of an epoxy of the insulator material to not less than approximately one percent.

In Example 19, the device of any one or more of Examples 14-18 can optionally further include the insulator layer is substantially fully cured after the conductor has been chemically bonded to the insulator layer.

In Example 20, the device of any one or more of Examples 14-19 can optionally further include the first conductive line, the second conductive line and the conductor are comprised of copper.

In Example 21, the device of any one or more of Examples 14-20 can optionally further include the insulator layer is a buildup layer.

Each of these non-limiting examples can stand on its own, or can be combined with one or more of the other examples in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An electronic device, comprising:
   an electronic chip;
   a substrate coupled to the chip, including a conductive line, comprising:
      a first copper layer;
      a second copper layer;
      an insulator layer positioned between the first conductive line and the second conductive line; and
   a via, formed through the insulator layer, including a copper conductor, abutting and chemically bonded to the insulator layer, that electrically couples the first conductive line to the second conductive line:
      wherein the insulator forms a via hole, the insulator layer having a surface facing the via hole, the surface having a surface roughness of less than about two hundred (200) nanometers, and wherein the via is formed in the via hole.

2. The electronic device of claim 1, wherein the conductor is chemically bonded to the insulator material by having been sputtered into the opening.

3. The electronic device of claim 2, wherein the insulator layer is only partially cured prior to the conductor being chemically bonded to the insulator material.

4. The electronic device of claim 3, wherein only partially curing the insulator layer comprises reducing a chemical reactivity of an epoxy of the insulator material to not less than approximately ten percent.

5. The electronic device of claim 4, wherein only partially curing the insulator layer comprises reducing a chemical reactivity of an epoxy of the insulator material to not less than approximately one percent.

6. The electronic device of claim 3, wherein the insulator layer is substantially fully cured after the conductor has been chemically bonded to the insulator layer.

7. The electronic device of claim 1, wherein the first conductive line, the second conductive line and the conductor are comprised of copper.

8. The electronic device of claim 7, wherein the insulator layer is a buildup layer.

9. The electronic device of claim 1, wherein the via, including the copper conductor, abuts the insulator layer by placing the copper conductor in direct physical contact with the insulator layer.

10. The electronic device of claim 1, wherein the copper conductor of the via is chemically bonded to the surface of the insulator layer facing the via hole.

* * * * *